(12) United States Patent
Nam et al.

(10) Patent No.: US 9,843,298 B2
(45) Date of Patent: Dec. 12, 2017

(54) POWER AMPLIFIER AND METHOD OF CONTROLLING OUTPUT OF POWER AMPLIFIER

(71) Applicant: Samsung Electro-Mechanics Co., Ltd., Suwon-si (KR)

(72) Inventors: Joong Jin Nam, Suwon-si (KR); Suk Chan Kang, Suwon-si (KR); Kwang Du Lee, Suwon-si (KR); Jae Hyouck Choi, Suwon-si (KR); Kyung Hee Hong, Suwon-si (KR); Kyu Jin Choi, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/991,357

(22) Filed: Jan. 8, 2016

(65) Prior Publication Data
US 2016/0276980 A1 Sep. 22, 2016

(30) Foreign Application Priority Data
Mar. 18, 2015 (KR) .................. 10-2015-0037321

(51) Int. Cl.
| | |
|---|---|
| *H03F 3/68* | (2006.01) |
| *H03F 3/21* | (2006.01) |
| *H03F 1/02* | (2006.01) |
| *H03F 3/191* | (2006.01) |
| *H03F 3/72* | (2006.01) |

(52) U.S. Cl.
CPC ........... *H03F 3/211* (2013.01); *H03F 1/0277* (2013.01); *H03F 3/191* (2013.01); *H03F 3/72* (2013.01); *H03F 2200/18* (2013.01); *H03F 2200/318* (2013.01); *H03F 2200/451* (2013.01); *H03F 2203/21106* (2013.01); *H03F 2203/7203* (2013.01); *H03F 2203/7206* (2013.01)

(58) Field of Classification Search
CPC ..................................... H03F 3/68; H03F 3/72
USPC .................................. 330/51, 84, 124 R, 295
See application file for complete search history.

(56) References Cited

U.S. PATENT DOCUMENTS

| | | | |
|---|---|---|---|
| 4,598,252 A * | 7/1986 | Andricos | H03F 3/72 330/124 R |
| 7,382,186 B2 * | 6/2008 | Apel | H03F 1/0277 330/124 R |
| 7,482,868 B2 | 1/2009 | Hageman et al. | |
| 2006/0261887 A1 | 11/2006 | Kim et al. | |
| 2010/0321110 A1 | 12/2010 | Ichitsubo et al. | |
| 2013/0241657 A1 | 9/2013 | Cho et al. | |

FOREIGN PATENT DOCUMENTS

KR 10-2013-0104639 A 9/2013

* cited by examiner

*Primary Examiner* — Steven J Mottola
(74) *Attorney, Agent, or Firm* — NSIP Law

(57) ABSTRACT

A power amplifier may include a first amplifying circuit configured to amplify an input RF signal; a second amplifying circuit connected to the first amplifying circuit in parallel configured to amplify the input RF signal; and a controller connected to at least one of the first amplifying circuit and the second amplifying circuit and configured to output a control signal in order to control an on-off state of at least one of the first amplifying circuit and the second amplifying circuit. Such an approach provides high efficiency without adding significant complexity to the power amplifier.

17 Claims, 6 Drawing Sheets

POWER AMPLIFIER AND METHOD OF CONTROLLING OUTPUT OF POWER AMPLIFIER

CROSS-REFERENCE TO RELATED APPLICATION(S)

This application claims the benefit under 35 USC 119(a) of Korean Patent Application No. 10-2015-0037321 filed on Mar. 18, 2015 in the Korean Intellectual Property Office, the entire disclosure of which is incorporated herein by reference for all purposes.

BACKGROUND

1. Field

The following description relates to a power amplifier (PA). The following description also relates to a method of controlling an output of a power amplifier.

2. Description of Related Art

A power amplifier may amplify a low RF signal having a preset frequency, such as a center frequency, f0, to output a high RF signal. In general, when the power amplifier outputs a RF signal having a maximum level, efficiency of the power amplifier is significantly increased, and as power of an output RF signal is decreased, the efficiency of the power amplifier may be reduced.

As a way to increase the efficiency of a power amplifier at low power output and medium power output levels, a means of independently designing a power amplifier having high efficiency at low power output and medium power output levels and a power amplifier also having high efficiency at a high power output level, respectively, may be used.

However, since such an approach additionally requires a switch, a low power amplifier, and other appropriate components, there are potential problems in that a circuit and a corresponding structure may be relatively complex and accordingly a size of such an integrated circuit may be increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a power amplifier and a method of controlling an output of such a power amplifier.

In one general aspect, a power amplifier includes a first amplifying circuit configured to amplify an input RF signal and to transfer an amplified RF signal to an antenna, a second amplifying circuit connected to the first amplifying circuit in parallel, configured to amplify the input RF signal during transferring the amplified RF signal to the antenna, and a controller connected to at least one of the first amplifying circuit and the second amplifying circuit and configured to output a control signal to control an on-off state of at least one of the first amplifying circuit and the second amplifying circuit.

The first amplifying circuit may include a first transistor circuit having a preset W/L or a preset number of transistors, the second amplifying circuit may include a second transistor circuit having a preset W/L or a preset number of transistors, the preset W/L of the first transistor circuit may be different from the preset W/L of the second transistor circuit, and the preset number of transistors of the first transistor circuit may be different from the preset number of the second transistor circuit.

The preset W/L of the first transistor circuit may be three times the preset W/L of the second transistor circuit, and the preset number of transistors of the first transistor circuit may be three times the preset number of transistors of the second transistor circuit.

The controller may performs controlling such that the first amplifying circuit and the second amplifying circuit are in the on state in response to the power amplifier being operated in a first mode, may perform controlling such that the first amplifying circuit is in the on state and the second amplifying circuit is in the off state in response to the power amplifier being operated in a second mode, and may perform controlling such that the first amplifying circuit is in the off state and the second amplifying circuit is in the on state in response to the power amplifier being operated in a third mode.

The power amplifier may further include a third amplifying circuit connected to input terminals of the first amplifying circuit and the second amplifying circuit and configured to amplify the input RF signal before the input RF signal is amplified by the first amplifying circuit and the second amplifying circuit, configured to output the amplified input RF signal into the first amplifying circuit and the second amplifying circuit, and a fourth amplifying circuit connected to the third amplifying circuit in parallel and configured to amplify the input RF signal before the input RF is amplified by the first amplifying circuit and the second amplifying circuit, configured to output the amplified input RF signal into the first amplifying circuit and the second amplifying circuit, wherein the controller is connected to at least one of the third amplifying circuit and the fourth amplifying circuit and outputs the control signal to control an on-off state of at least one of the third amplifying circuit and the fourth amplifying circuit.

The third amplifying circuit may include a third transistor circuit having a preset W/L or a preset number of transistors, the fourth amplifying circuit may include a fourth transistor circuit having a preset W/L or a preset number of transistors, the preset W/L of the third transistor circuit may be different from the preset W/L of the fourth transistor circuit, and the preset number of transistors of the third transistor circuit is different from the preset number of the fourth transistor circuit.

The preset W/L of the third transistor circuit may be two times the preset W/L of the fourth transistor circuit, and the preset number of transistors of the third transistor circuit may be two times the preset number of transistors of the fourth transistor circuit.

The controller may perform controlling such that the third amplifying circuit and the fourth amplifying circuit are in the on state in response to the power amplifier being operated in a first mode, may perform controlling such that the third amplifying circuit is in the on state and the fourth amplifying circuit is in the off state in response to the power amplifier being operated in a second mode or a third mode, and may perform controlling such that the third amplifying circuit is in the off state and the fourth amplifying circuit is in the on state in response to the power amplifier being operated in a fourth mode.

In another general aspect, a power amplifier includes driving amplifiers connected to each other in parallel, configured to amplify an input RF signal, power amplifying circuits connected to each other in parallel, configured to amplify the signal amplified by the driving amplifiers, and a biasing circuit connected to the driving amplifiers and the power amplifying circuits, configured to bias the driving amplifiers and the power amplifying circuits, wherein the biasing circuit changes a bias of one of the driving amplifiers or one of the power amplifiers to control an on-off state of one of the driving amplifiers or one of the power amplifiers.

The biasing circuit may perform biasing such that the driving amplifiers and the power amplifying circuits are in the on state in response to the power amplifier being operated in a first mode, and may perform biasing such that one of the driving amplifiers and one of the power amplifying circuits are in the off state in response to the power amplifier being operated in a second mode.

A total W/L or a total number of the power amplifying circuits may be sixteen-thirds times a total W/L or a total number of the driving amplifiers, and the biasing circuit may perform biasing such that the driving amplifiers and the power amplifying circuits are in the on state in response to the power amplifier being operated in a first mode, may perform biasing such that the driving amplifiers corresponding to two-thirds of the total W/L of the driving amplifiers or two-thirds of the total number of the driving amplifiers are in the on state and the power amplifying circuits corresponding to three-fourths of the total W/L of the power amplifying circuits or three-fourths of the total number of the power amplifying circuits are in the on state in response to the power amplifier being operated in a second mode, may perform biasing such that the driving amplifiers corresponding to two-thirds of the total W/L of the driving amplifiers or two-thirds of the total number of the driving amplifiers are in the on state and the power amplifying circuits corresponding to one-fourth of the total W/L of the power amplifying circuits or one-fourth of the total number of the power amplifying circuits are in the on state in response to the power amplifier being operated in a third mode, and may perform biasing such that the driving amplifiers corresponding to one-third of the total W/L of the driving amplifiers or one-third of the total number of the driving amplifiers are in the on state and the power amplifying circuits corresponding to one-fourth of the total W/L of the plurality of power amplifying circuits or one-fourth of the total number of the plurality of power amplifying circuits are in the on state in response to the power amplifier being operated in a fourth mode.

In another general aspect, a method of controlling an output of a power amplifier includes changing an operation of an on-off state of a driving amplifier of driving amplifiers connected to each other in parallel, configured to amplify an input RF signal, and changing an operation of an on-off state of a power amplifying circuit of power amplifying units connected to each other in parallel, configured to amplify the signal amplified by the driving amplifiers.

The changing of the operation of the driving circuit may be performed by using a biasing circuit to change a bias of the driving circuit, and the changing of the operation of the power amplifying circuit may be performed by using the biasing circuit to change a bias of the power amplifying circuit.

The biasing circuit may perform biasing such that the driving amplifiers and the power amplifying circuits are in the on state in response to the power amplifier being operated in a first mode, and may perform biasing such that one of the driving amplifiers and one of the power amplifying circuits are in the off state in response to the power amplifier being operated in a second mode.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Subsequently, examples are described in further detail with reference to the accompanying drawings.

Figure 1:
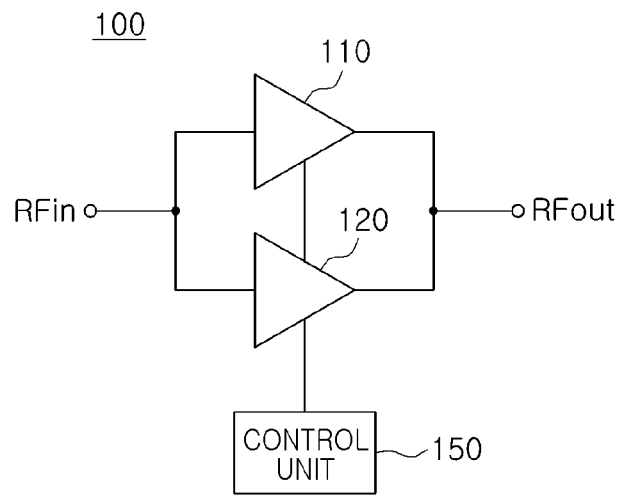
FIG. 1 is a diagram illustrating a power amplifier according to an example.

FIG. 1 is a diagram illustrating a power amplifier according to an example.

Referring to the example of FIG. 1, the power amplifier 100 includes a first amplifying unit 110, a second amplifying unit 120, and a control unit 150.

For example, the first amplifying unit 110 amplifies an input RF signal. Here, the input RF signal is input through an input port RFin. The signal amplified by the first amplifying unit 110 is output through an output port RFout. In an example, the output port RFout is connected to an antenna, not illustrated.

In this example, the second amplifying unit 120 is connected to the first amplifying unit 110 in parallel in order to amplify the input RF signal. Thus, an input terminal of the second amplifying unit 120 and an input terminal of the first amplifying unit 110 respectively amplify the input RF signal input through the input port RFin. Furthermore, an output terminal of the second amplifying unit 120 and an output terminal of the first amplifying unit 110 are connected to each other to commonly output the amplified signal to the output port RFout.

Each of the first amplifying unit 110 and the second amplifying unit 120 potentially have limited performance in terms of a maximum gain, a breakdown voltage, linearity, and other similar characteristics. Therefore, in such an example, the first amplifying unit 110 and the second amplifying unit 120 are connected to each other in parallel, thereby efficiently amplifying the input RF signal.

For example, the control unit 150 is connected to at least one of the first amplifying unit 110 and the second amplifying unit 120 and outputs a control signal to control an on-off state of at least one of the first amplifying unit 110 and the second amplifying unit 120. Here, the on state denotes that an amount of voltage source, bias voltage, bias current, or a similar input provided to the amplifying unit is within a preset range. Here, the off state denotes that the amount of voltage source, bias voltage, bias current, or a similar input provided to the amplifying unit is outside of the preset range.

For example, the control unit 150 outputs the control signal by performing controlling such that the amount of voltage source, bias voltage, or bias current provided to at least one of the first amplifying unit 110 and the second amplifying unit 120 is close to 0 and also performs controlling such that at least one of the first amplifying unit 110 and the second amplifying unit 120 is maintained to be in the off state.

For example, the control signal is also input into a circuit biasing the first amplifying unit 110 and the second amplifying unit 120. A description of such input of the control section is provided in further detail below with reference to FIG. 4.

Thus, the control unit 150 controls the on-off state of at least one of the first amplifying unit 110 and the second amplifying unit 120. As a result, the control unit 150 efficiently outputs signals having various power levels.

In addition, the control unit 150 controls the on-off state of at least one of the first amplifying unit 110 and the second amplifying unit 120 while not requiring a switch, an additional amplifying terminal, an additional impedance matching means, and other similar additional components, generally required to output the signals having various power levels.

Figure 2:
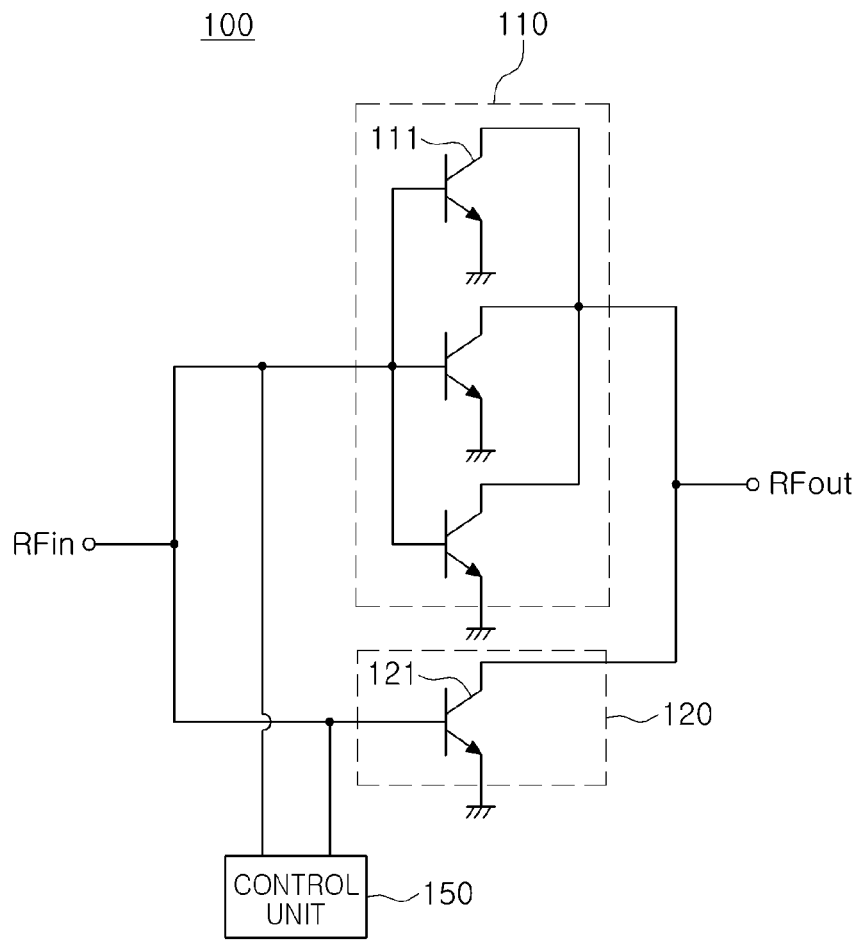
FIG. 2 is a circuit diagram illustrating the power amplifier of the example of FIG. 1.

FIG. 2 is a circuit diagram illustrating the power amplifier of the example of FIG. 1.

Referring to the example of FIG. 2, the first amplifying unit 110 includes a first transistor unit 111 having a preset W/L or a preset number of transistors. In such an example, W/L refers to a ratio between the channel width and channel length of the transistor unit. In addition, the second amplifying unit 121 includes a second transistor unit 121 having a preset W/L or a preset number of transistors.

In such an example, the preset W/L of the first transistor unit 111 is different from the preset W/L of the second transistor unit 121, and the preset number of transistors of the first transistor unit 111 is different from the preset number of transistors of the second transistor unit 121. In addition, the preset number of transistors means the number of transistors connected to each other in parallel. For example, a relationship between the channel width of the transistor and amplification characteristics is similar to a relationship between the number of transistors and the amplification characteristics.

Specifically, in an example, the preset W/L of the first transistor unit 111 is three times the preset W/L of the second transistor unit 121, and the preset number of transistors of the first transistor unit 111 is three times the preset number of transistors of the second transistor unit 121.

Hence, in an example in which the first transistor unit 111 and the second transistor unit 121 are bipolar junction transistors (BJTs), a collector terminal and an emitter terminal of the first transistor unit 111 are respectively connected to a collector terminal and an emitter terminal of the second transistor unit 121, and a base terminal of the first transistor unit 111 and a base terminal of the second transistor unit 121 are separated from each other at a specific ratio.

Here, the control unit 150 performs controlling so that the first amplifying unit 110 and the second amplifying unit 120 are in the on state when the power amplifier is operated in a first mode, performs controlling so that the first amplifying unit 110 is in the on state and the second amplifying unit 120 is in the off state when the power amplifier is operated in a second mode, and performs controlling so that the first amplifying unit 110 is in the off state and the second amplifying unit 120 is in the on state when the power amplifier is operated in a third mode. Thus, in such an example, in the first mode, the input RF signal is amplified by four transistors connected to each other in parallel, in the second mode, the input RF signal is amplified by three transistors connected to each other in parallel, and in the third mode, the input RF signal is amplified by one transistor.

Figure 3:
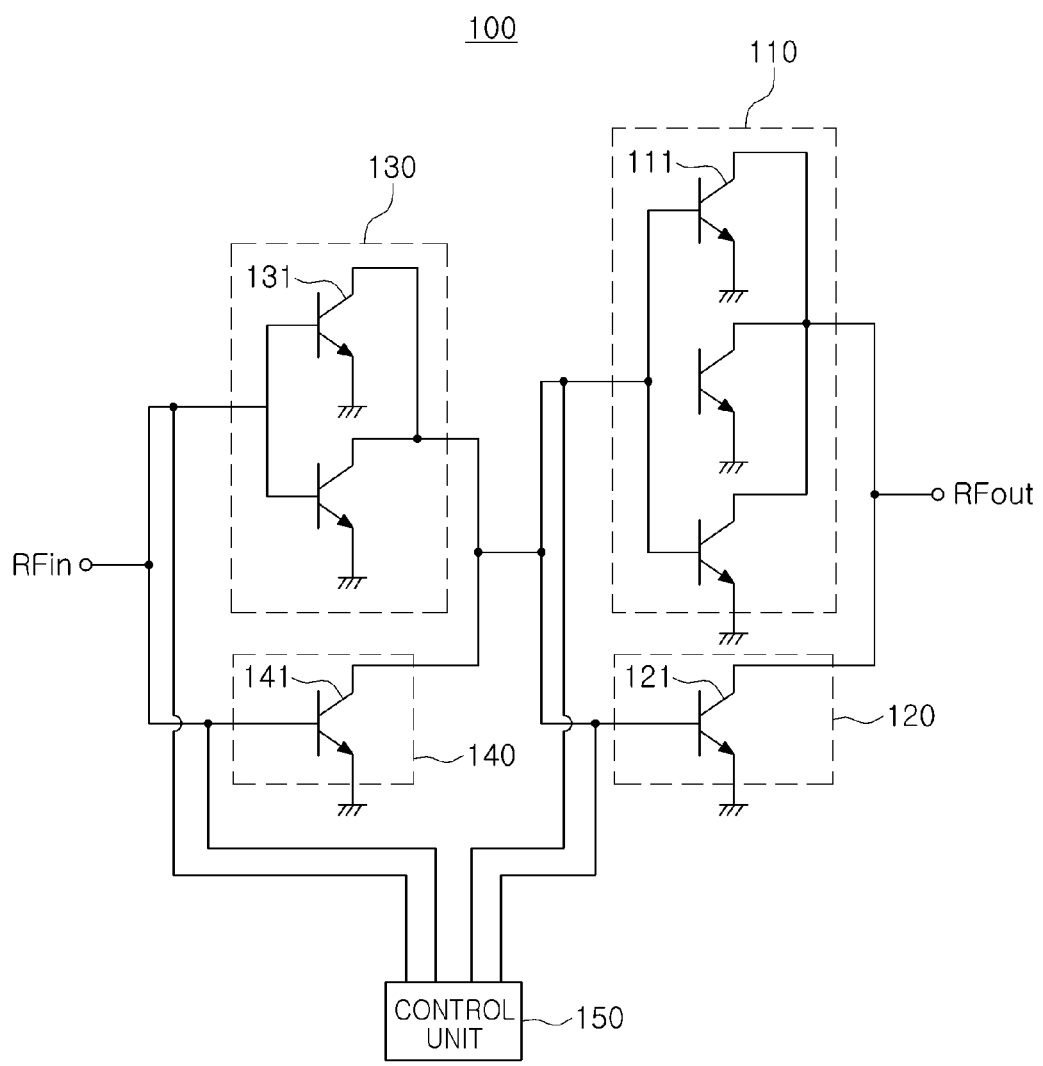
FIG. 3 is an enlarged circuit diagram of the power amplifier of the example of FIG. 1.

FIG. 3 is an enlarged circuit diagram of the power amplifier of the example of FIG. 1.

Referring to the example of FIG. 3, the power amplifier 100 further includes a third amplifying unit 130 and a fourth amplifying unit 140.

The third amplifying unit 130 is connected to the input terminals of the first amplifying unit 110 and the second amplifying unit 120 and amplifies the input RF signal before being amplified by the first amplifying unit 110 and the second amplifying unit 120 to output the amplified input RF signal to the first amplifying unit 110 and the second amplifying unit 120. For instance, the third amplifying unit 130 amplifies the input RF signal, which is a low signal, to assume a magnitude within an amplification range of the first amplifying unit 110 and the second amplifying unit 120.

For example, the third amplifying unit 130 includes a third transistor unit 131 having a preset W/L or a preset number of transistors.

In this example, the fourth amplifying unit 140 is connected to the third amplifying unit 130 in parallel and amplifies the input RF signal before being amplified by the first amplifying unit 110 and the second amplifying unit 120, so as to output the amplified input RF signal to the first amplifying unit 110 and the second amplifying unit 120.

For example, the fourth amplifying unit 140 includes a fourth transistor unit 141 having a preset W/L or a preset number of transistors. In such an example, the preset W/L of the third transistor unit 131 is different from the preset W/L of the fourth transistor unit 141, and the preset number of transistors of the third transistor unit 131 is different from the preset number of transistors of the fourth transistor unit 141.

Specifically, in such an example, the preset W/L of the third transistor unit 131 is twice that of the fourth transistor unit 141, and the preset number of transistors of the third transistor unit 131 is two times the preset number of transistors of the fourth transistor unit 141.

Meanwhile, in this example, the control unit 150 is connected to at least one of the third amplifying unit 130 and the fourth amplifying unit 140 and outputs a control signal to control an on-off state of at least one of the third amplifying unit 130 and the fourth amplifying unit 140.

For example, the control unit 150 performs controlling so that the third amplifying unit 130 and the fourth amplifying unit 140 are in the on state when the power amplifier is operated in the first mode, performs controlling so that the third amplifying unit 130 is in the on state and the fourth amplifying unit 140 is in the off state when the power amplifier is operated in the second mode or the third mode, and performs controlling so that the third amplifying unit 130 is in the off state and the fourth amplifying unit 140 is in the on state when the power amplifier is operated in a fourth mode.

Thus, for example, in the first mode, the input RF signal is amplified by three transistors connected to each other in parallel, in the second mode or the third mode, the input RF signal is amplified by two transistors connected to each other in parallel, and in the fourth mode, the input RF signal is amplified by a single transistor.

Also, in an example, the control unit 150 controls the on-off state of at least one of the first amplifying unit 110, the second amplifying unit 120, the third amplifying unit 130, and the fourth amplifying unit 140, such that operation ratios of a plurality of amplifying units do not significantly depart from a preset ratio. As a result, the control unit 150 efficiently outputs signals having various power levels.

Hereinafter, a power amplifier 200 according to an example is described further. Descriptions that are the same as or correspond to the description of the power amplifier 100 as described above with reference to FIGS. 1 through 3 are omitted for brevity.

Figure 4:
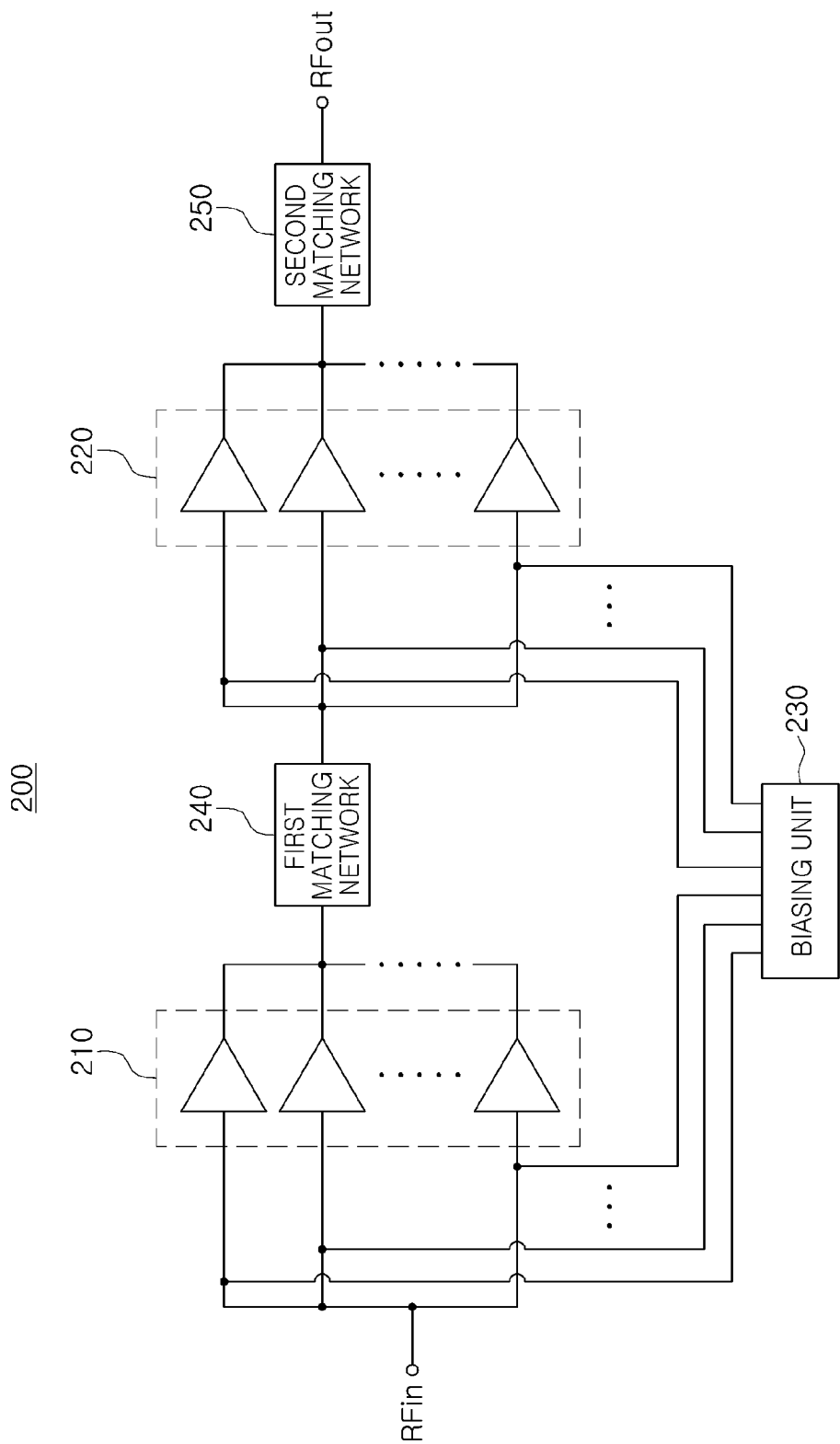
FIG. 4 is a diagram illustrating a power amplifier according to an example.

FIG. 4 is a diagram illustrating a power amplifier according to an example.

Referring to the example of FIG. 4, the power amplifier 200 includes a plurality of driving amplifiers 210, a plurality of power amplifying units 220, a biasing unit 230, a first matching network 240, and a second matching network 250.

In the example of FIG. 4, the amplifiers of the plurality of driving amplifiers (DA) 210 are connected to each other in parallel so as to amplify an input RF signal. For example, the plurality of driving amplifiers 210 amplify the input RF signal, a low signal, to a magnitude that is within an amplification range of the plurality of power amplifying units 220.

In this example, the plurality of power amplifying units 220 are connected to each other in parallel so as to amplify the signal amplified by the plurality of driving amplifiers 210.

The biasing unit 230 is connected to the plurality of driving amplifiers 210 and the plurality of power amplifying units 220, so as to bias the plurality of driving amplifiers and the plurality of power amplifying units. Here, the biasing means that a current or voltage having a specific value is provided so that a bias current flows into a specific block or an element or a bias voltage is applied to the specific block or the element.

In addition, in such an example, the biasing unit 230 changes a bias of at least one of the plurality of driving amplifiers 210 or at least one of the plurality of power amplifying units 220 in order to control an on-off state of at least one of the plurality of driving amplifiers 210 or at least one of the plurality of power amplifying units 220.

For example, the biasing unit 230 decreases the bias current provided to at least one of the plurality of power amplifying units 220 in order to change at least one of the plurality of power amplifying units 220 to the off state. More specifically, in an example in which the plurality of power amplifying units 220 include 16 power amplifying units 220, the biasing unit 230 changes the bias current so that a current provided to four of the power amplifying units is close to 0 mA.

For example, the biasing unit 230 biases the plurality of driving amplifiers 210 and the plurality of power amplifying units 220 so that the plurality of driving amplifiers 210 and the plurality of power amplifying units 220 are in the on state when the power amplifier is operated in a first mode, and biases the plurality of driving amplifiers 210 and the plurality of power amplifying units 220 so that at least one of the plurality of driving amplifiers 210 and at least one of the plurality of power amplifying units 220 are in the off state when the power amplifier is operated in a second mode.

Thus, the biasing unit 230 controls the on-off state of at least one of the plurality of driving amplifiers 210 and the plurality of power amplifying unit 220, such that the power amplifier 200 efficiently amplifies the signal while not requiring a switch, an additional amplifying terminal, an additional impedance matching means, and other related similar components, required in other approaches in order to output signals having various power levels.

In this example, the first matching network 240 is connected between the plurality of driving amplifiers 210 and the plurality of power amplifying units 220 so as to have a preset impedance.

The second matching network 250 is connected between the plurality of power amplifying units 220 and an output port RF_OUT so as to have preset impedance. For example, each of the first matching network 240 and the second matching network 250 includes an inductor and a capacitor.

Figure 5:
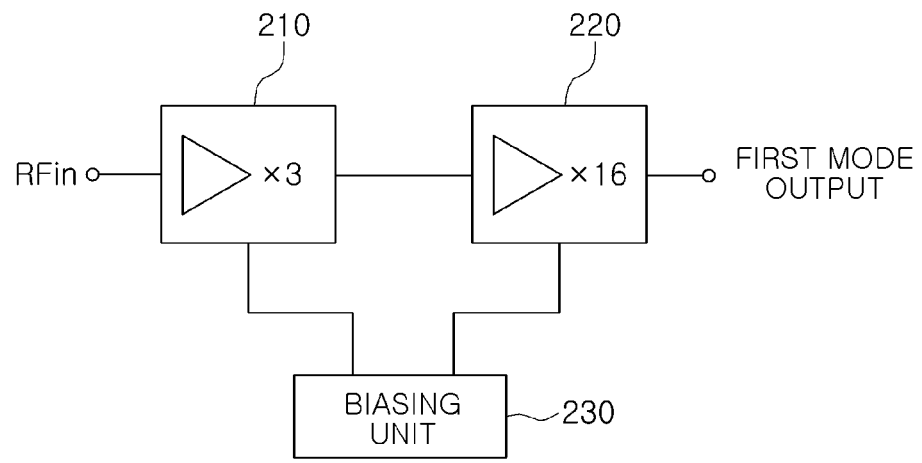
FIG. 5 is a view illustrating a first mode of operation of the power amplifier of the example of FIG. 4.

FIG. 5 is a view illustrating a first mode of operation of the power amplifier of the example of FIG. 4.

Referring to the example of FIG. 5, when the power amplifier 200 is operated in the first mode it outputs a high power signal that is a signal having a larger power than a preset power.

In this example, three driving amplifiers of the plurality of driving amplifiers 210 amplify the signal, and sixteen power amplifying units of the plurality of power amplifying units 220 amplify the signal. For instance, the number of driving amplifiers and the number of power amplifying units is provided at a specific ratio. Thus, the power amplifier 200 efficiently amplifies the input RF signal so as to output the high power signal.

Figure 6:
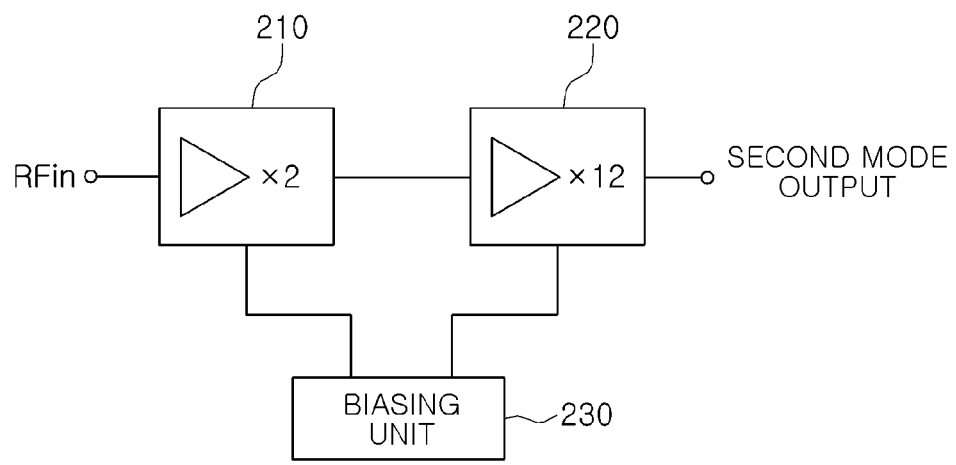
FIG. 6 is a view illustrating a second mode of operation of the power amplifier of the example of FIG. 4.

FIG. 6 is a view illustrating a second mode of operation of the power amplifier of the example of FIG. 4.

Referring to the example of FIG. 6, when the power amplifier 200 is operated in the second mode it outputs a middle power signal having a preset power.

In this example, two driving amplifiers of the plurality of driving amplifiers 210 amplify the signal, and twelve power amplifying units of the plurality of power amplifying units 220 amplify the signal. In such an example, a ratio of the number of operating driving amplifiers and the number of operating power amplifying units does not significantly depart from the ratio of the number of driving amplifiers and the number of power amplifying units. Thus, the power amplifier 200 efficiently amplifies the input RF signal to output the middle power signal.

Figure 7:
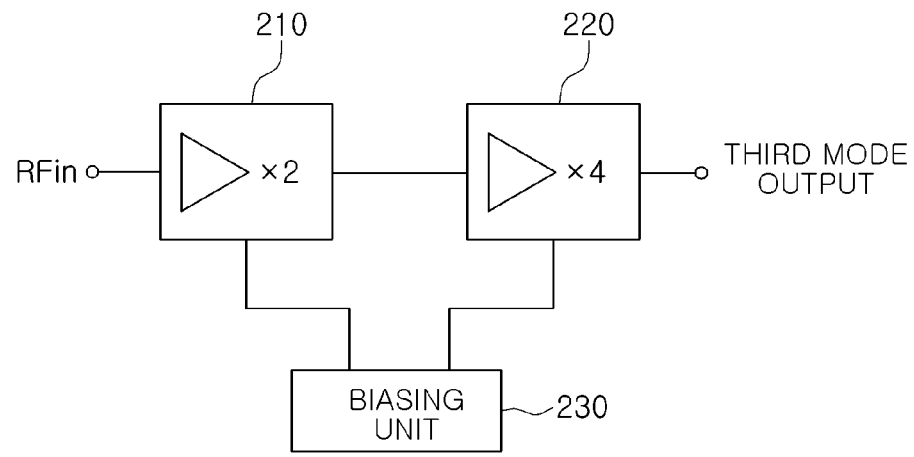
FIG. 7 is a view illustrating a third mode of operation of the power amplifier of the example of FIG. 4.

FIG. 7 is a view illustrating a third mode of operation of the power amplifier of the example of FIG. 4.

Referring to FIG. 7, when the power amplifier 200 is operated in the third mode it outputs a low power signal, denoting a signal that has smaller amount of power than a preset amount of power.

In this example, two driving amplifiers of the plurality of driving amplifiers 210 amplify the signal, and four power amplifying units of the plurality of power amplifying units 220 amplify the signal. Similarly to the operation of the second mode, the ratio of the number of operating driving amplifiers and the number of operating power amplifying units does not significantly depart from the ratio of the number of driving amplifiers and the number of power amplifying units. Thus, the power amplifier 200 efficiently amplifies the input RF signal to output the low power signal.

Meanwhile, on the basis of using a log scale, a power differential between the high power signal and the middle power signal is potentially similar to a power differential between the middle power signal and the low power signal. For example, the power amplifier according to the example in the present disclosure gradually changes a power of an output signal while not significantly departing from the ratio of the number of operating driving amplifiers and the number of operating power amplifying units, during a process in which the operation of the power amplifier is changed from the first mode to the third mode. Thus, the power amplifier efficiently outputs the signal while precisely controlling a power of the output signal.

Figure 8:
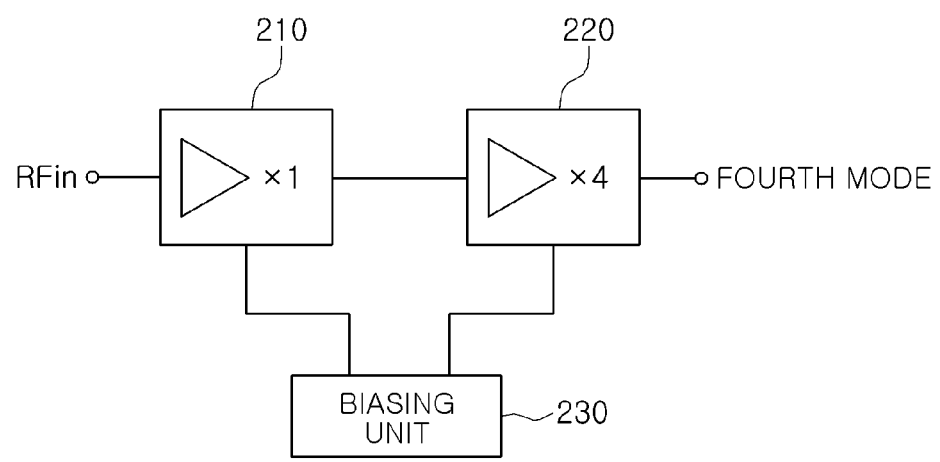
FIG. 8 is a view illustrating a fourth mode of operation of the power amplifier of the example of FIG. 4.

FIG. 8 is a view illustrating a fourth mode of operation of the power amplifier of the example of FIG. 4.

Referring to the example of FIG. 8, when the power amplifier 200 is operated in the fourth mode it is quiescent, without inputting the input RF signal.

In such an example, one driving amplifier of the plurality of driving amplifiers 210 is operated, and four power amplifying units of the plurality of power amplifying units 220 are operated. Similarly to the second mode, the ratio of the number of operating driving amplifiers and the number of operating power amplifying units does not significantly depart from the ratio of the number of driving amplifiers and the number of power amplifying units. Thus, in such a mode, the power amplifier 200 is stably quiescent.

Subsequently, a method of controlling an output of a power amplifier according to an example is described. Since the method of controlling the output of the power amplifier is performed by the power amplifier 100 described above with reference to FIG. 1 or the power amplifier 200 described above with reference to FIG. 4, descriptions that are the same as or correspond to the description provided above are omitted for brevity.

Figure 9:
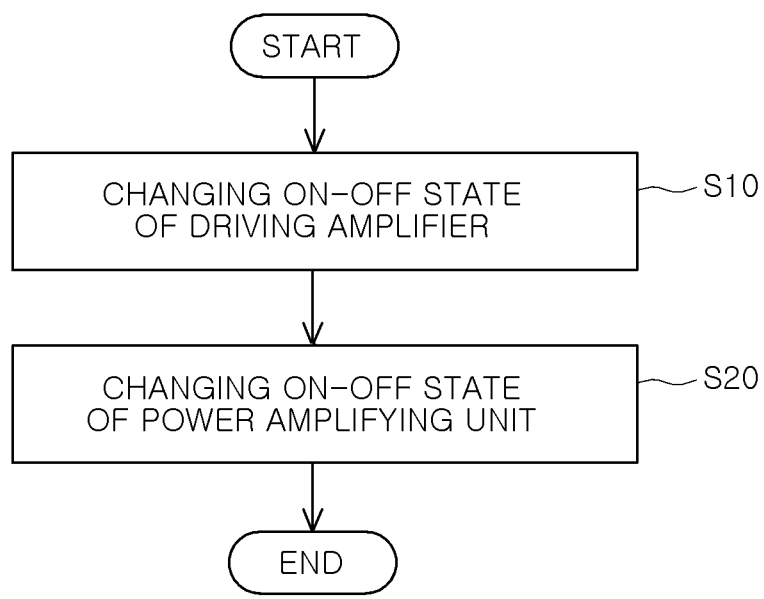
FIG. 9 is a flowchart illustrating a method of controlling an output of a power amplifier according to an example.

FIG. 9 is a flow chart illustrating a method of controlling an output of a power amplifier according to an example.

Referring to the example of FIG. 9, the method of controlling an output includes a driving amplifier changing operation S10 and a power amplifying unit changing operation S20.

In an example, the method of controlling an output is performed autonomously by an internal control circuit of the power amplifier. In another example, the method of controlling an output is performed by an external control circuit.

In the driving amplifier changing operation S10, the power amplifier changes an on-off state of at least one of a plurality of driving amplifiers connected to each other in parallel to amplify an input RF signal.

In the power amplifying unit changing operation S20, the power amplifier changes an on-off state of at least one of a plurality of power amplifying units connected to each other in parallel to amplify the signal amplified by the plurality of driving amplifiers.

For example, the power amplifier changes a bias of at least one of the plurality of driving amplifiers or at least one of the plurality of power amplifying units to change the on-off state thereof.

For example, when a total W/L or a total number of the plurality of power amplifying units is sixteen-thirds times a total W/L or a total number of the plurality of driving amplifiers, the power amplifier in the driving amplifier changing operation S10 changes the driving amplifiers so that when an operation mode of the power amplifier is changed, the driving amplifiers corresponding to one-third of the total W/L of the plurality of driving amplifiers or one-third of the total number of the plurality of driving amplifiers are in the on state or the off state. The power amplifier also changes the rest of the driving amplifiers corresponding to two-thirds of the total W/L of the plurality of driving amplifiers or two-thirds of the total number of the plurality of driving amplifiers are in the off state or the on state, accordingly. Also, the power amplifier in the power amplifying unit changing operation S20 changes the power amplifying units so that when the operation mode of the power amplifier is changed, the power amplifying units corresponding to one-fourth of the total W/L of the plurality of power amplifying units or one-fourth of the total number of the plurality of power amplifying units are in the on state or the off state. The power amplifier also changes the rest of the power amplifying units corresponding to three-fourth of the total W/L of the plurality of power amplifying units or three-fourth of the total number of the plurality of power amplifying units are in the off state or the on state, accordingly.

As set forth above, according to the examples, the power amplifier efficiently outputs the signals having various power levels.

In addition, since the power amplifier according to the examples does not require a switch, an additional amplifying terminal, an additional impedance matching means, and other similar components, used in other approaches to output the signals having various power levels, a unit cost and a size of the power amplifier is reduced, and a degree of freedom of a design and utilization are increased.

The apparatuses, units, modules, devices, and other components illustrated in FIGS. 1-9 that perform the operations described herein with respect to FIGS. 1-9 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-9. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-9 that perform the operations described herein with respect to FIGS. 1-9 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:
   a first amplifying circuit configured to amplify an input RF signal and to transfer an amplified RF signal to an antenna;
   a second amplifying circuit connected to the first amplifying circuit in parallel, configured to amplify the input RF signal during transferring the amplified RF signal to the antenna; and
   a controller connected to at least one of the first amplifying circuit and the second amplifying circuit and configured to output a control signal to control an on-off state of at least one of the first amplifying circuit and the second amplifying circuit,
   wherein the first amplifying circuit comprises a first transistor circuit having a preset W/L or a preset number of transistors,
   the second amplifying circuit comprises a second transistor circuit having a preset W/L or a preset number of transistors,
   the preset W/L of the first transistor circuit is different from the preset W/L of the second transistor circuit,
   the preset number of transistors of the first transistor circuit is different from the preset number of the second transistor circuit, and
   the controller performs controlling such that the first amplifying circuit and the second amplifying circuit are in the on state in response to the power amplifier being operated in a first mode, performs controlling such that the first amplifying circuit is in the on state and the second amplifying circuit is in the off state in response to the power amplifier being operated in a second mode, and performs controlling such that the first amplifying circuit is in the off state and the second amplifying circuit is in the on state in response to the power amplifier being operated in a quiescent mode.

2. The power amplifier of claim 1, wherein the second transistor circuit of the second amplifying circuit is connected in parallel with the first transistor circuit.

3. A power amplifier comprising:
   a first amplifying circuit configured to amplify an input RF signal and to transfer an amplified RF signal to an antenna;

a second amplifying circuit connected to the first amplifying circuit in parallel, configured to amplify the input RF signal during transferring the amplified RF signal to the antenna; and a controller connected to at least one of the first amplifying circuit and the second amplifying circuit and configured to output a control signal to control an on-off state of at least one of the first amplifying circuit and the second amplifying circuit, wherein the first amplifying circuit comprises a first transistor circuit having a preset W/L or a preset number of transistors, the second amplifying circuit comprises a second transistor circuit having a preset W/L or a preset number of transistors, the preset W/L of the first transistor circuit is different from the preset W/L of the second transistor circuit, the preset number of transistors of the first transistor circuit is different from the preset number of the second transistor circuit, the preset W/L of the first transistor circuit is three times the preset W/L of the second transistor circuit, and the preset number of transistors of the first transistor circuit is three times the preset number of transistors of the second transistor circuit.

4. The power amplifier of claim 1, further comprising:
a third amplifying circuit connected to input terminals of the first amplifying circuit and the second amplifying circuit and configured to amplify the input RF signal before the input RF signal is amplified by the first amplifying circuit and the second amplifying circuit, configured to output the amplified input RF signal into the first amplifying circuit and the second amplifying circuit; and a fourth amplifying circuit connected to the third amplifying circuit in parallel and configured to amplify the input RF signal before the input RF is amplified by the first amplifying circuit and the second amplifying circuit, configured to output the amplified input RF signal into the first amplifying circuit and the second amplifying circuit, wherein the controller is connected to at least one of the third amplifying circuit and the fourth amplifying circuit and outputs the control signal to control an on-off state of at least one of the third amplifying circuit and the fourth amplifying circuit.

5. The power amplifier of claim 4, wherein the third amplifying circuit comprises a third transistor circuit having a preset W/L or a preset number of transistors, the fourth amplifying circuit comprises a fourth transistor circuit connected in parallel with the third transistor circuit and having a preset W/L or a preset number of transistors, the preset W/L of the third transistor circuit is different from the preset W/L of the fourth transistor circuit, and the preset number of transistors of the third transistor circuit is different from the preset number of the fourth transistor circuit.

6. The power amplifier of claim 5, wherein the preset W/L of the third transistor circuit is two times the preset W/L of the fourth transistor circuit, and the preset number of transistors of the third transistor circuit is two times the preset number of transistors of the fourth transistor circuit.

7. The power amplifier of claim 5, wherein the controller performs controlling such that the third amplifying circuit and the fourth amplifying circuit are in the on state in response to the power amplifier being operated in a first mode, performs controlling such that the third amplifying circuit is in the on state and the fourth amplifying circuit is in the off state in response to the power amplifier being operated in a second mode or a third mode, and performs controlling such that the third amplifying circuit is in the off state and the fourth amplifying circuit is in the on state in response to the power amplifier being operated in a fourth mode.

8. A power amplifier, comprising:
driving amplifiers connected to each other in parallel, configured to amplify an input RF signal;

power amplifying circuits connected to each other in parallel, such that at least one transistor circuit of the power amplifying circuits is connected in parallel with at least another one transistor circuit of the power amplifying circuits, the power amplifying circuits being configured to amplify the signal amplified by the driving amplifiers; and a biasing circuit connected to the driving amplifiers and the power amplifying circuits, configured to bias the driving amplifiers and the power amplifying circuits, wherein the biasing circuit changes a bias of one of the driving amplifiers or one of the power amplifiers to control an on-off state of one of the driving amplifiers or one of the power amplifiers, and wherein a total W/L or a total number of the power amplifying circuits is sixteen-thirds times a total W/L or a total number of the driving amplifiers, and the biasing circuit performs biasing such that the driving amplifiers and the power amplifying circuits are in the on state in response to the power amplifier being operated in a first mode, performs biasing such that the driving amplifiers corresponding to two-thirds of the total W/L of the driving amplifiers or two-thirds of the total number of the driving amplifiers are in the on state and the power amplifying circuits corresponding to three-fourths of the total W/L of the power amplifying circuits or three-fourths of the total number of the power amplifying circuits are in the on state in response to the power amplifier being operated in a second mode, performs biasing such that the driving amplifiers corresponding to two-thirds of the total W/L of the driving amplifiers or two-thirds of the total number of the driving amplifiers are in the on state and the power amplifying circuits corresponding to one-fourth of the total W/L of the power amplifying circuits or one-fourth of the total number of the power amplifying circuits are in the on state in response to the power amplifier being operated in a third mode, and performs biasing such that the driving amplifiers corresponding to one-third of the total W/L of the driving amplifiers or one-third of the total number of the driving amplifiers are in the on state and the power amplifying circuits corresponding to one-fourth of the total W/L of the plurality of power amplifying circuits or one-fourth of the total number of the plurality of power amplifying circuits are in the on state in response to the power amplifier being operated in a fourth mode.

9. The power amplifier of claim 8, wherein the biasing circuit performs biasing such that the driving amplifiers and the power amplifying circuits are in the on state in response to the power amplifier being operated in a first mode, and performs biasing such that one of the driving amplifiers and one of the power amplifying circuits are in the off state in response to the power amplifier being operated in a second mode.

10. The power amplifier of claim 2, wherein the controller performs controlling such that the first amplifying circuit and the second amplifying circuit are in the on state in response to the power amplifier being operated in a first mode, performs controlling such that the first amplifying circuit is in the on state and the second amplifying circuit is in the off state in response to the power amplifier being operated in a second mode, and performs controlling such that the first amplifying circuit is in the off state and the second amplifying circuit is in the on state in response to the power amplifier being operated in a third mode.

11. A power amplifier comprising:
- a first amplifying circuit configured to amplify an input RF signal and to transfer an amplified RF signal to an antenna;
- a second amplifying circuit connected to the first amplifying circuit in parallel, configured to amplify the input RF signal during transferring the amplified RF signal to the antenna;
- a third amplifying circuit connected to input terminals of the first amplifying circuit and the second amplifying circuit and configured to amplify the input RF signal before the input RF signal is amplified by the first amplifying circuit and the second amplifying circuit, configured to output the amplified input RF signal into the first amplifying circuit and the second amplifying circuit;
- a fourth amplifying circuit connected to the third amplifying circuit in parallel and configured to amplify the input RF signal before the input RF is amplified by the first amplifying circuit and the second amplifying circuit, configured to output the amplified input RF signal into the first amplifying circuit and the second amplifying circuit; and
- a controller connected to at least one of the first amplifying circuit and the second amplifying circuit and configured to output a control signal to control an on-off state of at least one of the first amplifying circuit and the second amplifying circuit to change between plural amplifying modes, including a quiescent mode, of the power amplifier,
- wherein an amplifying circuit, of the first amplifying circuit and the second amplifying circuit, is controlled to be in an on state for each of the plural amplifying modes except the quiescent mode when another amplifying circuit, of the first amplifying circuit and the second amplifying circuit, is controlled to be in an on state, and
- wherein the controller is connected to at least one of the third amplifying circuit and the fourth amplifying circuit and outputs the control signal to control an on-off state of at least one of the third amplifying circuit and the fourth amplifying circuit.

12. The power amplifier of claim 11, wherein the first amplifying circuit comprises a first transistor circuit having a preset W/L or a preset number of transistors,
- the second amplifying circuit comprises a second transistor circuit connected in parallel with the first transistor circuit and having a preset W/L or a preset number of transistors,
- the preset W/L of the first transistor circuit is different from the preset W/L of the second transistor circuit, and
- the preset number of transistors of the first transistor circuit is different from the preset number of the second transistor circuit.

13. The power amplifier of claim 12, wherein the preset W/L of the first transistor circuit is three times the preset W/L of the second transistor circuit, and
- the preset number of transistors of the first transistor circuit is three times the preset number of transistors of the second transistor circuit.

14. The power amplifier of claim 12, wherein the controller performs controlling such that the first amplifying circuit and the second amplifying circuit are in the on state in response to the power amplifier being operated in a first mode, performs controlling such that the first amplifying circuit is in the on state and the second amplifying circuit is in the off state in response to the power amplifier being operated in a second mode, and performs controlling such that the first amplifying circuit is in the off state and the second amplifying circuit is in the on state in response to the power amplifier being operated in a third mode.

15. The power amplifier of claim 11, wherein the third amplifying circuit comprises a third transistor circuit having a preset W/L or a preset number of transistors,
- the fourth amplifying circuit comprises a fourth transistor circuit connected in parallel with the third transistor circuit and having a preset W/L or a preset number of transistors,
- the preset W/L of the third transistor circuit is different from the preset W/L of the fourth transistor circuit, and
- the preset number of transistors of the third transistor circuit is different from the preset number of the fourth transistor circuit.

16. The power amplifier of claim 15, wherein the preset W/L of the third transistor circuit is two times the preset W/L of the fourth transistor circuit, and
- the preset number of transistors of the third transistor circuit is two times the preset number of transistors of the fourth transistor circuit.

17. The power amplifier of claim 15, wherein the controller performs controlling such that the third amplifying circuit and the fourth amplifying circuit are in the on state in response to the power amplifier being operated in a first mode, performs controlling such that the third amplifying circuit is in the on state and the fourth amplifying circuit is in the off state in response to the power amplifier being operated in a second mode or a third mode, and performs controlling such that the third amplifying circuit is in the off state and the fourth amplifying circuit is in the on state in response to the power amplifier being operated in a fourth mode.

* * * * *